(12) United States Patent
Wang

(10) Patent No.: US 11,796,913 B2
(45) Date of Patent: Oct. 24, 2023

(54) ORGANIC LIGHT-EMITTING DISPLAY DEVICE AND MANUFACTURING METHOD THEREOF

(71) Applicants: Chengdu BOE Optoelectronics Technology Co., Ltd., Sichuan (CN); BOE TECHNOLOGY GROUP CO., LTD., Beijing (CN)

(72) Inventor: Benlian Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 261 days.

(21) Appl. No.: 16/762,263

(22) PCT Filed: Dec. 11, 2019

(86) PCT No.: PCT/CN2019/124563
§ 371 (c)(1),
(2) Date: May 7, 2020

(87) PCT Pub. No.: WO2020/140704
PCT Pub. Date: Jul. 9, 2020

(65) Prior Publication Data
US 2021/0318615 A1 Oct. 14, 2021

(30) Foreign Application Priority Data
Jan. 4, 2019 (CN) .......................... 201910010410.7

(51) Int. Cl.
*G03F 7/038* (2006.01)
*G03F 7/32* (2006.01)
(Continued)

(52) U.S. Cl.
CPC ............ *G03F 7/0382* (2013.01); *G03F 7/325* (2013.01); *H10K 50/84* (2023.02); *H10K 71/00* (2023.02)

(58) Field of Classification Search
CPC ...... G03F 7/0382; G03F 7/325; G03F 7/0007; H10K 50/84; H10K 71/00; H10K 50/844; H10K 59/00; H10K 59/65; H04M 1/0266
See application file for complete search history.

(56) References Cited

U.S. PATENT DOCUMENTS 10,559,633 B2   2/2020 Chen
2012/0205678 A1* 8/2012 Ikeda .................. H01L 51/5203
                                                              438/22
(Continued)

FOREIGN PATENT DOCUMENTS

CN       106887523 A     6/2017
CN       107039493 A     8/2017
(Continued)

OTHER PUBLICATIONS

Office Action dated Jun. 10, 2020, issued in counterpart CN Application No. 201910010410.7, with English Translation. (18 pages).
(Continued)

*Primary Examiner* — Su C Kim
(74) *Attorney, Agent, or Firm* — WHDA, LLP

(57) ABSTRACT

An organic light-emitting display device and a manufacturing method thereof are disclosed. The display device includes a substrate including a first area, a second area and a third area, the second area being located between the first area and the third area; a plurality of pixels on the substrate, the plurality of pixels being located in the third area; a boss portion on the substrate, the boss portion being located in the second area; and an opening located in the first area and surrounded by the plurality of pixels. Each of the pixels (Continued)

includes a first electrode layer, an organic light-emitting layer, and a second electrode layer which are sequentially arranged in a direction away from the substrate. At least one of the organic light-emitting layer and the second electrode layer extends toward the opening and is disconnected at the boss portion. The boss portion includes a photoresist material.

5 Claims, 8 Drawing Sheets

(51) Int. Cl.
*H10K 50/84* (2023.01)
*H10K 71/00* (2023.01)

(56) References Cited

U.S. PATENT DOCUMENTS

| | | | | |
|---|---|---|---|---|
| 2013/0248867 A1* | 9/2013 | Kim | ................... | H01L 27/3246 438/34 |
| 2014/0183479 A1* | 7/2014 | Park | ................... | H01L 27/3218 438/34 |
| 2017/0162637 A1 | 6/2017 | Choi et al. | | |
| 2017/0323936 A1 | 11/2017 | Lee et al. | | |
| 2018/0013092 A1 | 1/2018 | Park | | |
| 2019/0245015 A1* | 8/2019 | Lee | ........................ | H01L 51/56 |
| 2019/0280246 A1 | 9/2019 | Cheng | | |

FOREIGN PATENT DOCUMENTS

| | | | |
|---|---|---|---|
| CN | 107210375 A | | 9/2017 |
| CN | 107452894 A | | 12/2017 |
| CN | 107808896 A | | 3/2018 |
| CN | 207116481 U | | 3/2018 |
| CN | 108417731 A | | 8/2018 |
| CN | 109087935 A | | 12/2018 |
| CN | 109742110 A | | 5/2019 |
| KR | 10-2018-001572 | * | 2/2018 |
| WO | 2018043250 A1 | | 3/2018 |

OTHER PUBLICATIONS

Office Action dated Jan. 6, 2022 issued in counterpart CN Application No. 201910010410.7 with English translation. (25 pages).

* cited by examiner

ORGANIC LIGHT-EMITTING DISPLAY DEVICE AND MANUFACTURING METHOD THEREOF

CROSS-REFERENCE TO RELATED APPLICATION

This application is a Section 371 National Stage Application of International Application No. PCT/CN2019/124563, filed on Dec. 11, 2019, entitled "ORGANIC LIGHT-EMITTING DISPLAY DEVICE AND MANUFACTURING METHOD THEREOF" which claims priority to Chinese Patent Application No. 201910010410.7 filed on Jan. 4, 2019 in the National Intelligent Property Administration of China, the whole disclosure of which is incorporated herein by reference.

TECHNICAL FIELD

The present disclosure generally relates to the field of organic light-emitting display technologies, and particularly relates to an organic light-emitting display device and a method for manufacturing the organic light-emitting display device.

BACKGROUND

In recent years, full-screen mobile phones have developed rapidly. Various mobile phone manufacturers and panel manufacturers are actively developing an opening-in-screen technology to place cameras, speakers, sensors and the like which are necessary for smart phones under the screen in order to achieve true full-screen display.

However, technical problems which may occur in current full-screen technology have not been properly resolved. An organic electro-luminescent material layer or a cathode layer at the opening may be exposed so that water vapor may easily enter into the display device, thereby causing some display areas to fail. Also, the organic electro-luminescent material layer and the cathode layer at the opening may be removed through a laser ablation process, so that a laser equipment is necessary to be added, thus the cost is relatively high.

SUMMARY

In an aspect, an organic light-emitting display device is provided, including: a substrate including a first area, a second area and a third area, the second area being located between the first area and the third area; a plurality of pixels on the substrate, the plurality of pixels being located in the third area; a boss portion on the substrate, the boss portion being located in the second area; and an opening located in the first area and surrounded by the plurality of pixels, wherein each of the pixels includes a first electrode layer, an organic light-emitting layer, and a second electrode layer which are sequentially arranged in a direction away from the substrate, and at least one of the organic light-emitting layer and the second electrode layer extends toward the opening and is disconnected at the boss portion, and wherein the boss portion includes a photoresist material.

According to some exemplary embodiments, the boss portion has a cross section extending in a first direction, the cross section has an inverted trapezoid shape, and the first direction is a direction from the pixels to the opening.

According to some exemplary embodiments, the boss portion includes a negative photoresist material.

According to some exemplary embodiments, both the organic light-emitting layer and the second electrode layer extend toward the opening and are disconnected at the boss portion.

According to some exemplary embodiments, each of the organic light-emitting layer and the second electrode layer includes a first portion on a side of the boss portion near the third area and a second portion on a surface of the boss portion away from the substrate, the first portion of each of the organic light-emitting layer and the second electrode layer is disconnected with the second portion of each of the organic light-emitting layer and the second electrode layer, and the first portion of each of the organic light-emitting layer and the second electrode layer is spaced apart from the boss portion.

According to some exemplary embodiments, each of the organic light-emitting layer and the second electrode layer further includes a third portion on a side of the boss portion near the first area, the third portion of each of the organic light-emitting layer and the second electrode layer is disconnected with the second portion of each of the organic light-emitting layer and the second electrode layer, and the third portion of each of the organic light-emitting layer and the second electrode layer is spaced apart from the boss portion.

According to some exemplary embodiments, a thickness of the boss portion is greater than a sum of a thickness of the organic light-emitting layer and a thickness of the second electrode layer.

According to some exemplary embodiments, the organic light-emitting display device further includes an encapsulating structure on a side of the second electrode layer away from the substrate, wherein the encapsulating structure covers both the second electrode layer and the boss portion.

According to some exemplary embodiments, the encapsulating structure includes a first inorganic encapsulating layer, an organic encapsulating layer, and a second inorganic encapsulating layer which are sequentially arranged in the direction away from the substrate, and each of the first inorganic encapsulating layer and the second inorganic encapsulating layer covers both the second electrode layer and the boss portion.

According to some exemplary embodiments, the first inorganic encapsulating layer fills a space between the first portion of each of the organic light-emitting layer and the second electrode layer and the boss portion, and also fills a space between the third portion of each of the organic light-emitting layer and the second electrode layer and the boss portion.

According to some exemplary embodiments, the opening penetrates the organic light-emitting layer, the second electrode layer, the first inorganic encapsulating layer, and the second inorganic encapsulating layer.

In another aspect, a method for manufacturing an organic light-emitting display device is provided, including the following steps:

providing a substrate including a first area, a second area and a third area, the second area being located between the first area and the third area;

forming a photoresist on the substrate, the photoresist covering the first area, the second area, and the third area of the substrate;

forming a first photoresist pattern in the first area of the substrate and a second photoresist pattern in the second area of the substrate, through an exposure process and a first development process;

sequentially forming a first electrode layer, an organic light-emitting layer and a second electrode layer on the substrate so that at least one of the organic light-emitting layer and the second electrode layer is disconnected at the second photoresist pattern; and removing the first photoresist pattern in the first area of the substrate and film layers on the first photoresist pattern, and retaining the second photoresist pattern in the second area of the substrate, through a second development process, to form an opening in the first area and a boss portion in the second area.

According to some exemplary embodiments, the photoresist is a negative photoresist.

According to some exemplary embodiments, the step of forming a first photoresist pattern in the first area of the substrate and a second photoresist pattern in the second area of the substrate through an exposure process and a first development process includes:

fully exposing a part of the photoresist in the second area, partially exposing a part of the photoresist in the first area, and unexposing a remaining part of the photoresist in the second and a part of the photoresist in the third area; and performing the first development process to remove unexposed parts of the photoresist, so as to form the first photoresist pattern in the first area of the substrate and the second photoresist pattern in the second area of the substrate.

According to some exemplary embodiments, a concentration of a developer used in the first development process is less than a concentration of a developer used in the second development process; and/or a development time in the first development process is less than a development time used in the second development process.

According to some exemplary embodiments, before the step of removing the first photoresist pattern in the first area of the substrate and film layers on the first photoresist pattern, the method further includes: forming an encapsulating structure on a side of the second electrode layer away from the substrate, wherein the encapsulating structure covers the second electrode layer, the first photoresist pattern and the second photoresist pattern.

According to some exemplary embodiments, between the step of forming an encapsulating structure on a side of the second electrode layer away from the substrate and the step of removing the first photoresist pattern in the first area of the substrate and film layers on the first photoresist pattern, the method further includes: removing film layers disposed on the substrate and located between the first photoresist pattern and the second photoresist pattern, through a dry etching process, to form a groove exposing the first photoresist pattern.

According to some exemplary embodiments, the step of sequentially forming a first electrode layer, an organic light-emitting layer and a second electrode layer on the substrate so that at least one of the organic light-emitting layer and the second electrode layer is disconnected at the second photoresist pattern includes: forming the organic light-emitting layer and the second electrode layer through an evaporation process, so that both the organic light-emitting layer and the second electrode layer are disconnected at the second photoresist pattern.

According to some exemplary embodiments, the step of removing the first photoresist pattern in the first area of the substrate and film layers on the first photoresist pattern includes: simultaneously removing the first photoresist pattern in the first area of the substrate and a part of each of the organic light-emitting layer, the second electrode layer and the encapsulating structure on the first photoresist pattern, through the second development process.

BRIEF DESCRIPTION OF THE DRAWINGS

Through detailed descriptions of non-limiting embodiments with reference to the following drawings, features, objectives, and advantages of the present disclosure will become more apparent.

DETAILED DESCRIPTION OF EMBODIMENTS

Figure 1:
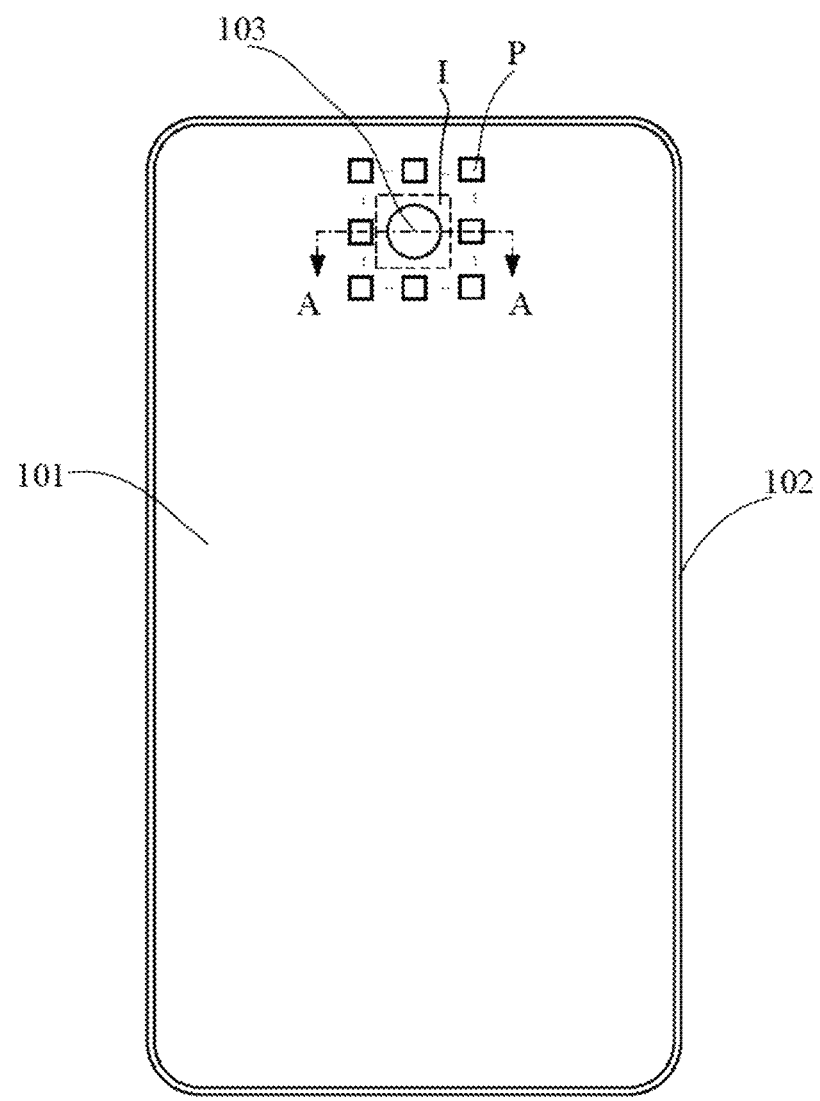
FIG. 1 is an exemplary schematic view of an organic light-emitting display device according to some embodiments of the present disclosure.

The present disclosure will be further described in detail below with reference to the drawings and embodiments. It can be understood that specific embodiments described herein are only used to explain technical solutions of the present disclosure, rather than limiting the present disclosure. It should be noted that, for ease of description, only parts related to the technical solutions of the present disclosure are shown in the drawings.

It should also be noted that the embodiments in the present disclosure and the features in the embodiments may be combined with each other without conflict. The present disclosure will be described in detail below with reference to the drawings and in conjunction with the embodiments.

For ease of explanation, sizes of components, elements or layers in the drawings may be exaggerated. In other words, as sizes and thicknesses of components, elements or layers in the drawings are arbitrarily shown for convenience of explanation, the following embodiments are not limited thereto.

It should be understood that the terms "first", "second" and the like used herein may be used to describe various elements, components, areas, layers and/or parts, but these elements, components, areas, layers and/or parts should not be limited by these terms. These terms are used to distinguish one element, component, area, layer or part from another element, component, area, layer or part. Therefore, without departing from the spirit and scope of the inventive concept of the present disclosure, the "first" element, component, area, layer or part hereinafter may also be referred to as the "second" element, component, area, layer or section or section.

For ease of description, relative spatial terms such as "below", "under". "beneath" "on", "above", or the like used herein may describe relationships between one element or feature and another element or feature as shown in the drawings. It should be understood that, in addition to orientations shown in the drawings, the relative spatial terms are intended to comprise other orientations of the device in use or in operation. For example, if the device in the drawings is flipped, the element described as "below", "under", or "beneath" another element or feature would be positioned "above" another element or feature. Therefore, for example, the terms "below", "under", "beneath" may include two orientations in which the element is "above" or "below" another element. The device may be otherwise positioned (e.g., rotated by 90 degrees or in other orientations). In addition, it should also be understood that, when a layer is referred to as being "between" two layers, it may be a single layer between the two layers, or there may be one or more intervening layers.

Referring to FIG. 1, which illustrates an exemplary schematic view of an organic light-emitting display device according to some embodiments of the present disclosure. As shown, the organic light-emitting display device includes a display area 101 and a non-display area 102. A pixel array including a plurality of pixels P is provided in the display area 101. The opening 103 is located in the display area 101 and is surrounded by the plurality of pixels P. For example, each pixel P may include a pixel circuit and an organic light-emitting diode (abbreviated as OLED) electrically connected to the pixel circuit, and provide an image by means of light emitted by the OLED. The non-display area 102 may surround the display area 101 or be located on one side of the display area, and driving units (such as drivers) for transmitting preset or predetermined signals to each pixel P in the display area 101, such as a scan driving unit (e.g., scan driver) and a data drive unit (e.g., data driver) may be disposed in the non-display area. It should be noted that a position of the opening 103 is not limited to the position shown in FIG. 1, and the opening 103 may be located at any position in the display area 101.

In FIG. 1, the opening 103 is circular, however, the embodiments of the present disclosure are not limited thereto. The opening 103 may have any of various suitable shapes, for example, polygon (e.g., rectangle, triangle), or ellipse. The number of openings 103 may be one or more.

It should be noted that the "° opening" described herein is an area on a display substrate for installing hardware structures. For convenience of description, it is called as an opening, and the opening includes, but is not limited to, the following forms: through hole, groove, opening, etc. Optionally, the hardware structures may include one or more of the following structures: front camera, HOME key, earpiece, or speaker. Specific installation manners of the hardware structures are not particularly limited in the embodiments of the present disclosure.

Figure 2A:
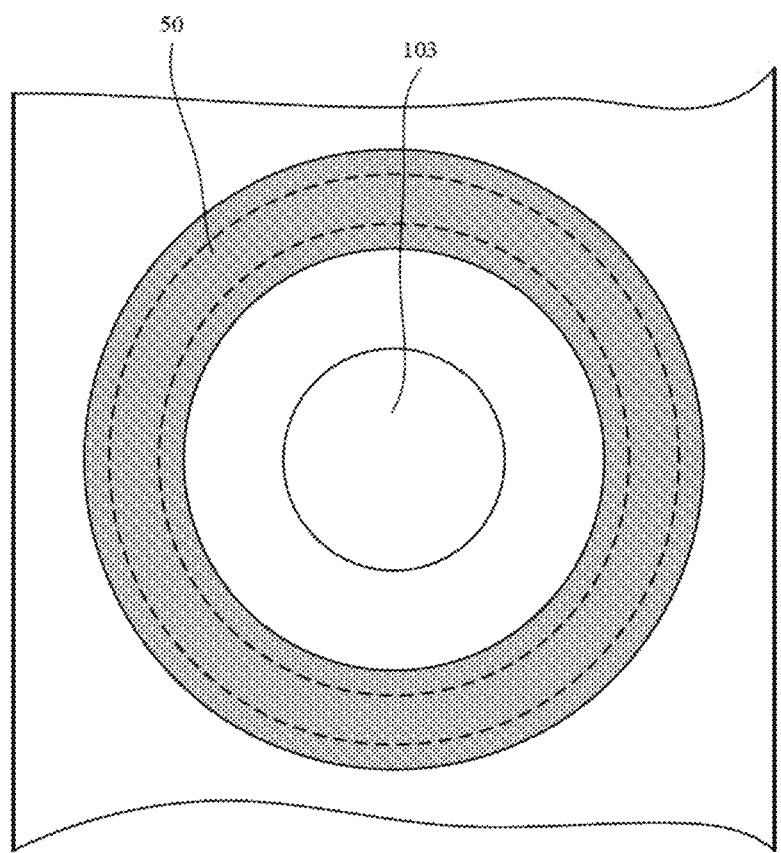
FIG. 2A is a partially enlarged view of portion I in FIG. 1.
Figure 2B:
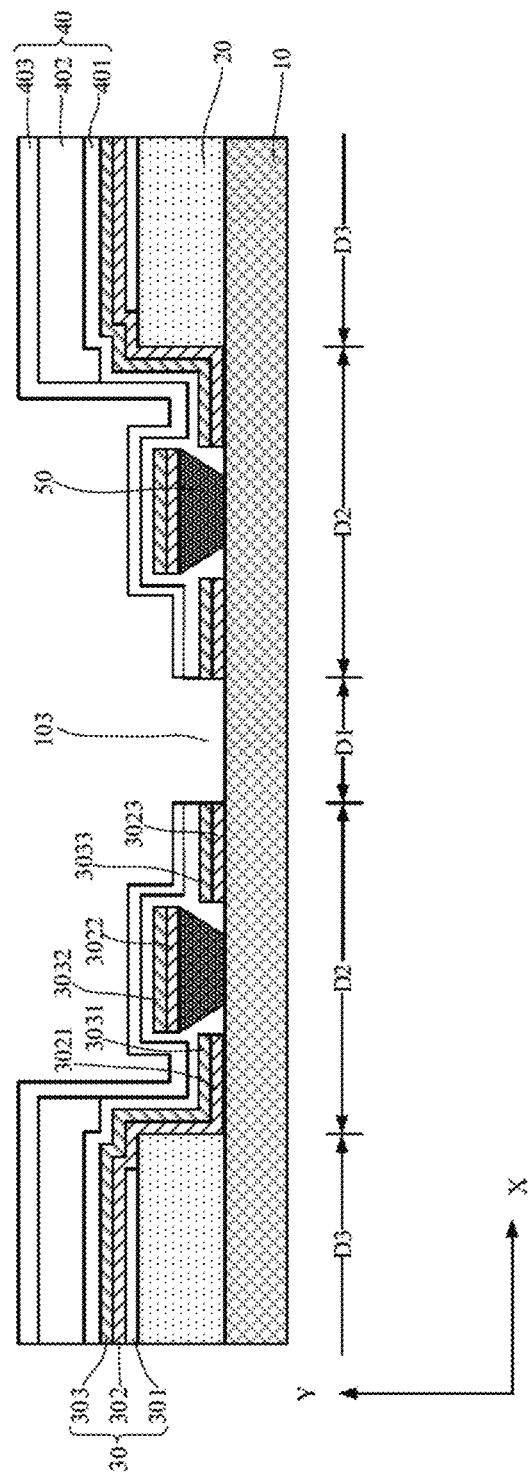
FIG. 2B is a cross-sectional view taken along line A-A in FIG. 1, which shows a cross section of an organic light-emitting display device according to some embodiments of the present disclosure.

FIG. 2A is a partially enlarged view of portion I in FIG. 1, and FIG. 2B is a cross-sectional view taken along line A-A in FIG. 1, which shows a cross section of an organic light-emitting display device according to some embodiments of the present disclosure. It should be noted that, in order to show clearly a positional relationship between an opening and a boss portion of the organic light-emitting display device according to some embodiments of the present disclosure, other film layers and structures of the organic light-emitting display device are omitted in FIG. 2A.

Referring to FIG. 2B, the organic light-emitting display device according to some embodiments of the present disclosure may include a substrate 10. The substrate 10 may be formed of a material such as glass, metal, or an organic material. According to some exemplary embodiments, the substrate 10 may be formed of flexible materials. For example, the substrate 10 may be formed of materials that are easily bent or curled, such as polyimide or the like.

Referring to FIG. 1 and FIG. 2B, the substrate 10 may include a first area D1 in which the opening 103 is disposed, a third area D3 in which the plurality of pixels P are disposed, and a second area D2 between the first area D1 and the third area D3.

The first area D1 of the substrate 10 is an area in which the opening 103 is located. As shown in FIG. 2B, the opening 103 penetrates each of film layers, which are disposed on the substrate 10 and located in the first area D1, in a direction perpendicular to the substrate 10 (i.e., Y direction in FIG. 2B), but the opening 103 does not penetrate the substrate 10. For example, the film layers here include, but are not limited to, an encapsulating layer, a planarization layer, an insulating layer, an electrode layer, an organic light-emitting layer, and the like.

The plurality of pixels P are located in the third area D3 of the substrate 10. For ease of explanation, FIG. 2B shows a partial structure of one of the plurality of pixels P adjacent to the opening 103.

A circuit layer 20 is provided on the substrate 10, for example, the circuit layer 20 may include a thin film transistor (TFT) and other film layers which are necessary for forning the thin film transistor and circuit connections. The circuit layer 20 includes, but is not limited to, a buffer layer, an active layer, a gate electrode layer, a source-drain electrode layer, a gate insulating layer, an interlayer insulating layer, and the like.

An organic light-emitting element (e.g. OLED) 30 is disposed on a side of the circuit layer 20 away from the substrate 10. For example, the organic light-emitting element 30 may be electrically connected to the thin film transistor of the circuit layer 20. As shown in FIG. 2B, the organic light-emitting element 30 may include a first electrode layer 301, a second electrode layer 303 disposed on a side of the first electrode layer 301 away from the substrate 10, and an organic light-emitting layer 302 sandwiched between the first electrode layer 301 and the second electrode layer 303.

For example, the first electrode layer 301 may include an anode, which may be a reflective electrode. The second electrode layer 303 may include a cathode, which may be a transparent electrode or a semi-transparent electrode.

An encapsulating structure 40 is disposed on a side of the organic light-emitting element 30 away from the substrate 10 and covers the organic light-emitting element 30. The encapsulating structure 40 may include film layers formed alternately of inorganic layers and organic layers. For example, the encapsulating structure 40 may include a first inorganic encapsulating layer 401, an organic encapsulating layer 402, and a second inorganic encapsulating layer 403 which are sequentially arranged. The first inorganic encapsulating layer 401, the organic encapsulating layer 402, and the second inorganic encapsulating layer 403 all cover the organic light-emitting element 30 to protect the organic light-emitting element 30 from water vapor and oxygen. Specifically, as shown in FIG. 2B, the first inorganic encapsulating layer 401 is formed on a side of the organic light-emitting element 30 away from the substrate 10, the organic encapsulating layer 402 is formed on a side of the first inorganic encapsulating layer 401 away from the substrate 10, and the second inorganic encapsulating layer 403 is formed on a side of the organic encapsulating layer 402 away from the substrate 10.

Continually referring to FIG. 2B, at least one of the organic light-emitting layer 302 and the second electrode layer 303 extends toward the opening 103 and covers the second area D2 of the substrate 10. According to some exemplary embodiments, for convenience of explanation, the organic light-emitting layer 302 and the second electrode layer 303 both extend toward the opening 103 and cover the second area D2.

According to some embodiments of the present disclosure, the organic light-emitting display device further includes a boss portion 50 located in the second area D2 of the substrate 10. Referring to FIG. 2A and FIG. 2B, the boss portion 50 surrounds the opening 103. For example, in the embodiments shown in FIG. 2A, the opening 103 is circular, and the boss portion 50 has an annular structure surrounding the opening 103. In FIG. 2A, two dashed lines represent a boundary of an orthographic projection of a bottom of the boss portion 50 on the substrate.

In the embodiments of the present disclosure, the boss portion 50 has a first surface (lower surface in FIG. 2B) near the substrate 10 and a second surface (upper surface in FIG. 2B) away from the substrate 10, an orthographic projection of the first surface on the substrate 10 falls into an orthographic projection of the second surface on the substrate 10, and an area of the orthographic projection of the first surface on the substrate 10 is smaller than an area of the orthographic projection of the second surface on the substrate 10.

For example, the boss portion 50 has a cross section that extends in the X direction, and the cross section has an inverted trapezoidal shape. It should be understood that the X direction is a direction from the plurality of pixels P toward the opening 103. In other words, the cross section of the boss portion 50 in a direction perpendicular to the substrate 10 (for example, a cross section in the XY plane shown in FIG. 2B) may have an inverted trapezoid shape, that is, a cross section of the boss portion 50 in a direction parallel to the substrate 10 gradually increases.

By providing the boss portion 50 configured in this way, when each of film layers (for example, the organic light-emitting layer 302 and the second electrode layer 303) of the organic light-emitting element 30 is formed through an evaporation process, each of the film layers of the organic light-emitting element 30 will be disconnected at the boss portion 50. Therefore, water vapor and oxygen will not invade the organic light-emitting element 30 along an interface between the organic light-emitting layer 302 and the second electrode layer 303 from a side surface of the opening 103, thereby improving an encapsulating reliability of the organic light-emitting display device.

Herein, each of the film layers of the organic light-emitting element 30 will be disconnected at the boss portion 50 may include the following cases. At least one of the organic light-emitting layer 302 and the second electrode layer 303 included in the organic light-emitting element 30 will be disconnected at the boss portion 50. For example, according to some exemplary embodiments, as shown in FIG. 2B, both the organic light-emitting layer 302 and the second electrode layer 303 are disconnected at the boss portion 50. Specifically, the organic light-emitting layer 302 may include a first portion 3021 located on a side of the boss portion 50 near the third area D3 and a second portion 3022 located on a surface of the boss portion 50 away from the substrate 10, and the first portion 3021 is disconnected with the second portion 3022. Optionally, the organic light-emitting layer 302 may further include a third portion 3023 located on a side of the boss portion 50 near the first area D1, and the third portion 3023 is disconnected with the second portion 3022. The second electrode layer 303 may include a first portion 3031 located on the side of the boss portion 50 near the third area D3 and a second portion 3032 located on the surface of the boss portion 50 away from the substrate 10, and the first portion 3031 is disconnected with the second portion 3032. Optionally, the second electrode layer 303 may further include a third portion 3033 located on the side of the boss portion 50 near the first area D1, and the third portion 3033 is disconnected with the second portion 3022.

In some exemplary embodiments, a material of the boss portion 50 may be a photoresist, for example, a negative photoresist, to facilitate obtaining a pattern of the boss portion 50 through a photolithography process.

Continually referring to FIG. 2B, a size (i.e., thickness) of the boss portion 50 in the direction (i.e., the Y direction in FIG. 2B) perpendicular to the substrate 10 is greater than a sum of sizes (i.e., thicknesses) of the film layers of the organic light-emitting element 30 in the direction (i.e., the Y direction in FIG. 2B) perpendicular to the substrate 10. For example, the thickness of the boss portion 50 is greater than the sum of the thicknesses of both the organic light-emitting layer 302 and the second electrode layer 303. Furthermore, the boss portion 50 is spaced apart from both the first portion 3021 and the third portion 3023 of the organic light-emitting layer 302, and the boss portion 50 is spaced apart from both the first portion 3031 and the third portion 3033 of the second electrode layer 303. With such an arrangement, it is advantageous for the film layers of the organic light-emitting element 30 to be disconnected at the boss portion 50.

Referring to FIG. 2B, at least one of the first inorganic encapsulating layer 401 and the second inorganic encapsulating layer 403 extends toward the opening 103 and covers the second area D2 of the substrate 10. According to some exemplary embodiments, for convenience of description, the first inorganic encapsulating layer 401 and the second inorganic encapsulating layer 403 both extend toward the opening 103 and cover the second area D2.

Since the boss portion 50 is spaced apart from both the first portion 3021 and the third portion 3023 of the organic light-emitting layer 302, and the boss portion 50 is spaced apart from both the first portion 3031 and the third portion 3033 of the second electrode layer 303, the first inorganic encapsulating layer 401 and the second inorganic encapsulating layer 403 may form a seal up to the substrate 10 through spaces between the boss portion 50 and the organic light-emitting layer 302/the second electrode layer 303, that is, both the first inorganic encapsulating layer 401 and the second inorganic encapsulating layer 403 encapsulate the boss 50. In this way, the boss portion 50 is entirely formed into a water blocking structure to further block water vapor and oxygen from invading the organic light-emitting element through the side surface of the opening 103, thereby further improving the encapsulating reliability of the organic light-emitting display device.

It should be noted that, in some embodiments, a bottom of the opening 103 connected to the substrate 10 has a narrowing structure. It should be noted that a width of the opening is usually in a millimeter scale, and an accuracy of the patterning process is in a micron scale, that is, the narrowing structure is negligible relative to the opening.

Figure 3:
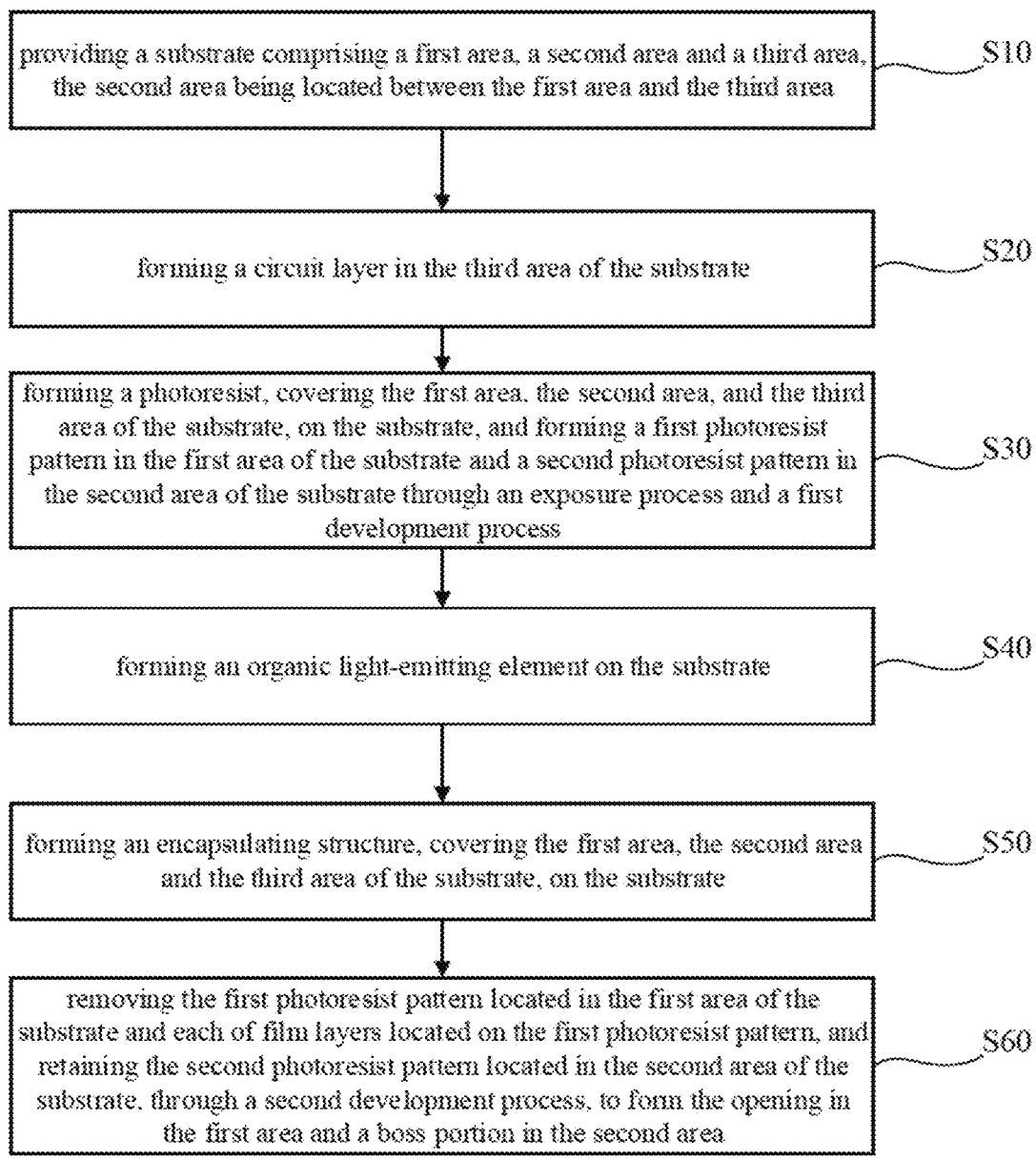
FIG. 3 is an exemplary flowchart of a method for manufacturing an organic light-emitting display device according to some embodiments of the present disclosure.

FIG. 3 shows an exemplary flowchart of a method for manufacturing an organic light-emitting display device according to some embodiments of the present disclosure. As shown, the method may include the following steps:

step S10, providing a substrate comprising a first area, a second area and a third area, the second area being located between the first area and the third area;

step S20, forming a circuit layer in the third area of the substrate;

step S30, forming a photoresist, covering the first area, the second area, and the third area of the substrate, on the substrate, and forming a first photoresist pattern in the first area of the substrate and a second photoresist pattern in the second area of the substrate through an exposure process and a first development process;

step S40, forming an organic light-emitting element on the substrate;

step S50, forming an encapsulating structure, covering the first area, the second area and the third area of the substrate, on the substrate; and step S60, removing the first photoresist pattern located in the first area of the substrate and each of film layers located on the first photoresist pattern, and retaining the second photoresist pattern located in the second area of the substrate, through a second development process, to form the opening in the first area and a boss portion in the second area.

The method for manufacturing the organic light-emitting display device according to the embodiments of the present disclosure will be specifically described below with reference to FIG. 4 to FIG. 10B.

Figure 4:
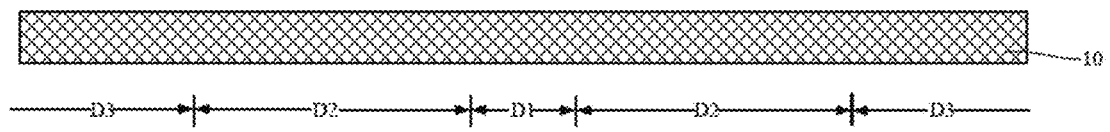
FIG. 4 to FIG. 10B show specific exemplary schematic views of a method for manufacturing an organic light-emitting display device according to some embodiments of the present disclosure.

In the step S10, a substrate 10 is provided. As shown in FIG. 4, the substrate 10 has a first area D1, a second area D2, and a third area D3. The second area D2 is located between the first area D1 and the third area D3. For example, the first area D1 is an area in which the opening to be formed is located, the second area D2 is an area in which the boss portion to be formed is located, and the third area D3 is an area in which the plurality of pixels to be formed are located.

Figure 5:
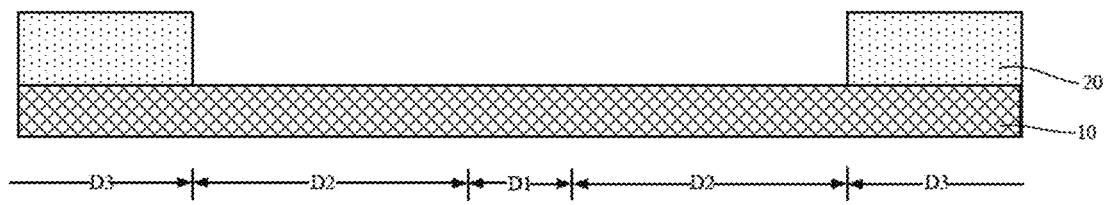

In the step S20, a circuit layer 20 is formed in the third area D3 of the substrate 10, as shown in FIG. 5.

According to some exemplary embodiments, the circuit layer 20 may include thin film transistors (TFTs) and other film layers which are necessary for forming the thin film transistors and circuit connections. The circuit layer 20 includes, but is not limited to, a buffer layer, an active layer, a gate electrode layer, a source-drain electrode layer, a gate insulating layer, an interlayer insulating layer, and the like. When these film layers are formed, these film layers may be firstly formed on the entire substrate, and then parts of these film layers located in the first area D1 and the second area D2 are etched away to form the circuit layer 20 in the third area D3.

Figure 6:
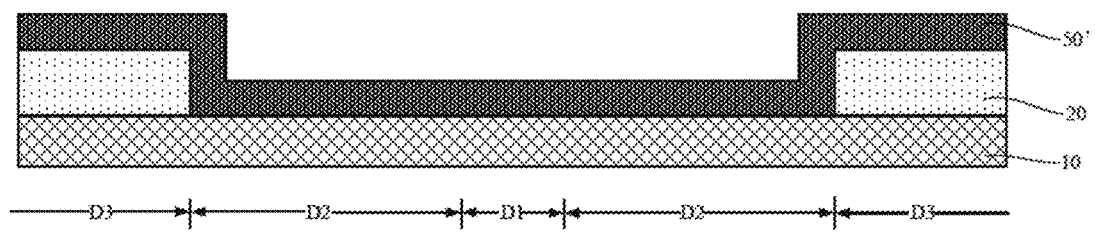

In the step S30, a photoresist 50', covering the first area D1, the second area D2, and the third area D3 of the substrate 10, is formed on the substrate 10. As shown in FIG. 6, the photoresist 50' covers the substrate 10 in the first area D1 and the second area D2, and the photoresist 50' covers the circuit layer 20 in the third area D3.

Figure 7:
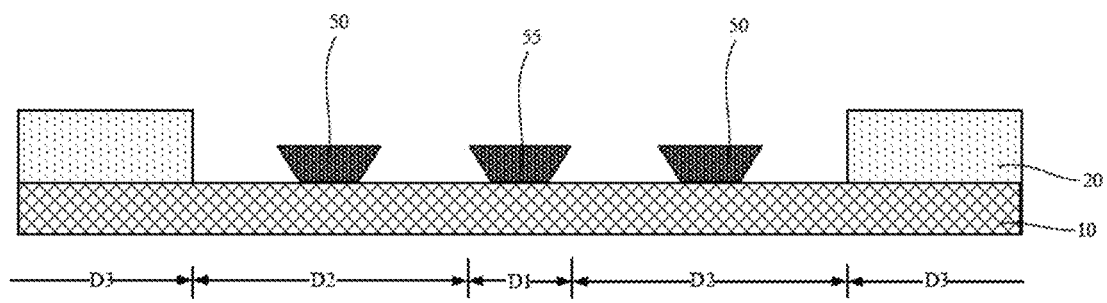

Then, as shown in FIG. 7, through the exposure process and the first development process, a first photoresist pattern 55 is formed in the first area D1 of the substrate 10, and a second photoresist pattern 55 is formed in the second area D2 of the substrate 10. The first photoresist pattern 55 corresponds to the opening to be formed, and the second photoresist pattern corresponds to the boss portion 50 described above.

Figure 7A:
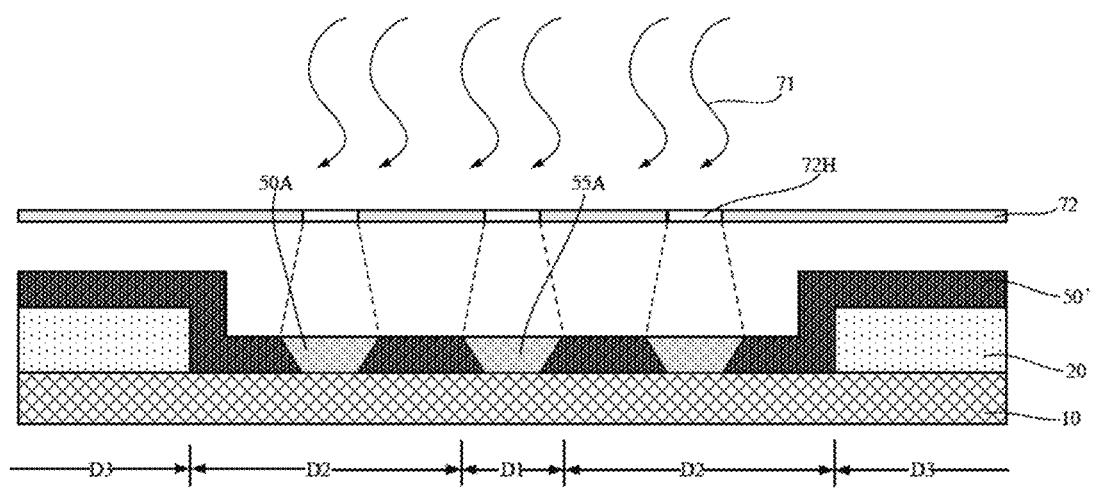

For example, the photoresist 50' may be a negative photoresist to facilitate obtaining an inverted trapezoidal pattern through a photolithography process. Referring to FIG. 7A, during the exposure process, partial diffraction occurs after light 71 passes through light-transmitting holes 72H formed in the mask 72, so that exposed portions 55A, 50A having an inverted trapezoidal structure are formed in the negative photoresist 50'. In this way, after being developed by using a developer, the exposed portions 55A, 50A are retained, thereby forming a first inverted trapezoidal photoresist pattern 55 and a second inverted trapezoidal photoresist pattern 50, respectively.

In some embodiments of the present disclosure, during the exposure process, the photoresist 50' in the first area D1, the second area D2, and the third area D3 is exposed to different degrees. Specifically, the photoresist 50' may be a negative photoresist, and the mask 72 is a half-tone mask.

In the exposure process, a part of the negative photoresist 50' in the second area D2 is fully exposed, so that the developer cannot remove the fully exposed negative photoresist 50' in a subsequent development process; a part of the negative photoresist 50' in the first area D1 is partially exposed so that the partially exposed negative photoresist 50' may be removed by a developer with a high concentration or by being developed for a long period in the subsequent development process; a remaining part of the negative photoresist 50' in the second area D2 and a part of the negative photoresist 50' in the third area are not exposed, so that the unexposed negative photoresist 50' may be removed by a developer with a low concentration or by being developed for a short period in the subsequent development process.

In the first development process, the developer with a low concentration is used or a development with a short period is performed to remove the unexposed negative photoresist 50', thereby forming the first photoresist pattern 55 and the second photoresist pattern 50 as shown in FIG. 7.

Figure 8:
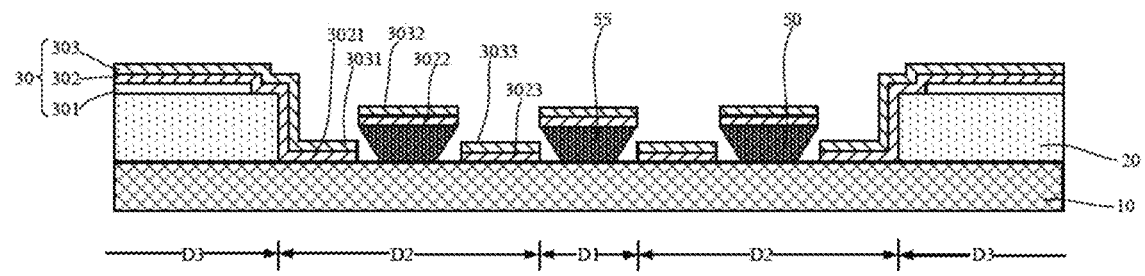

In the step S40, the organic light-emitting element 30 is formed on the substrate 10, as shown in FIG. 8.

For example, the first electrode layer 301 of the organic light-emitting element 30 may be formed through a patterning process, and the first electrode layer 301 is formed only in the third area D3 of the substrate 10. The organic light-emitting layer 302 and the second electrode layer 303 of the organic light-emitting element 30 are formed through an evaporation process. Since the second photoresist pattern (i.e., the boss portion) 50 has an inverted trapezoidal structure which is wide in its upper side and is narrow in its lower side, the organic light-emitting layer 302 and the second electrode layer 303 formed by the evaporation process will be disconnected at the second photoresist pattern (i.e., the boss portion) 50.

As shown in FIG. 8, both the organic light-emitting layer 302 and the second electrode layer 303 are disconnected at the boss portion 50. Specifically, the organic light-emitting layer 302 may include a first portion 3021 located on the side of the boss portion 50 near the third area D3 and a second portion 3022 located on the surface of the boss portion 50 away from the substrate 10, and the first portion 3021 is disconnected with the second portion 3022. Optionally, the organic light-emitting layer 302 may further include a third portion 3023 located on the side of the boss portion 50 near the first area D1, and the third portion 3023 is disconnected with the second portion 3022. The second electrode layer 303 may include a first portion 3031 located on the side of the boss portion 50 near the third area D3 and a second portion 3032 located on the surface of the boss portion 50 away from the substrate 10, and the first portion 3031 is disconnected with the second portion 3032. Optionally, the second electrode layer 303 may further include a third portion 3033 located on the side of the boss portion 50 near the first area D1, and the third portion 3033 is disconnected with the second portion 3022.

Figure 9:
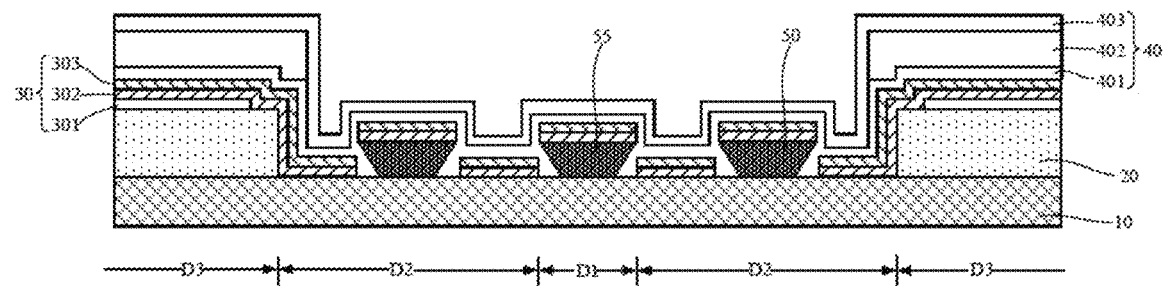

In the step S50, an encapsulating structure 40, covering the first area D1, the second area D2, and the third area D3 of the substrate 10, is formed on the substrate 10, as shown in FIG. 9.

For example, the encapsulating structure 40 may include a first inorganic encapsulating layer 401, an organic encapsulating layer 402, and a second inorganic encapsulating layer 403 which are disposed in this order. The first inorganic encapsulating layer 401, the organic encapsulating layer 402, and the second inorganic encapsulating layer 403 all cover the organic light-emitting element 30 to protect the organic light-emitting element 30 from water vapor and oxygen.

At least one of the first inorganic encapsulating layer 401 and the second inorganic encapsulating layer 403 extends toward the opening 103 and covers the second area D2 of the substrate 10. According to some exemplary embodiments, for convenience of description, the first inorganic encapsulating layer 401 and the second inorganic encapsulating layer 403 both extend toward the opening 103 and cover the second area D2.

Since the boss portion 50 is spaced apart from both the first portion 3021 and the third portion 3023 of the organic light-emitting layer 302, and the boss portion 50 is spaced apart from both the first portion 3031 and the third portion 3033 of the second electrode layer 303, the first inorganic encapsulating layer 401 and the second inorganic encapsulating layer 403 may seal up to the substrate 10 through the spaces between the boss portion 50 and the organic light-emitting layer 302/the second electrode layer 303, that is, the first inorganic encapsulating layer 401 and the second inorganic encapsulating layer 403 both cover the boss portion 50. In this way, the boss portion 50 is entirely formed into a water blocking structure to further block water vapor and oxygen from invading the organic light-emitting element from the side surface of the opening 103, thereby further improving the encapsulating reliability of the organic light-emitting display device.

In the step S60, through the second development process, the first photoresist pattern 55 located in the first area D1 of the substrate 10 and each of the film layers disposed on the first photoresist pattern 55 are removed, and the second photoresist pattern 50 located in the second area D2 of the substrate 10 is retained, to form the opening 103 in the first area D1 and form the boss portion 50 in the second area D2, as shown in FIG. 2B.

Figure 10A:
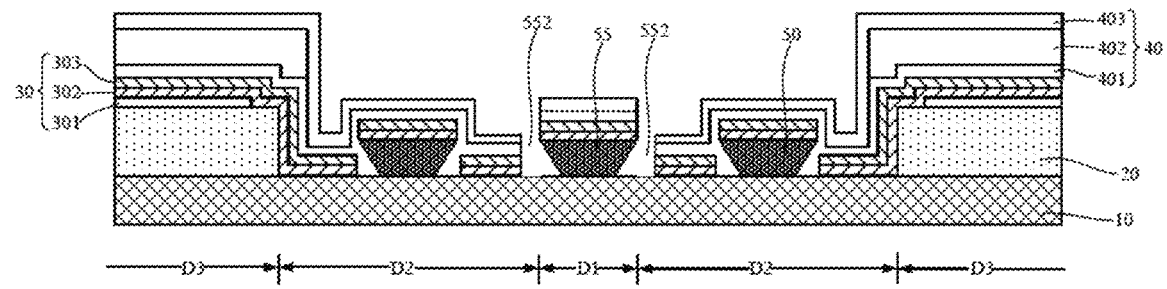

For example, between the step S50 and the step S60, an etching process may be performed to remove each of film layers disposed on the substrate 10 and located between the first photoresist pattern 55 and the second photoresist pattern 50. Referring to FIG. 9 and FIG. 10.4, a dry etching process may be performed to remove the organic light-emitting layer 302, the second electrode layer 303, the first inorganic encapsulating layer 401 and the second inorganic encapsulating layer 403 between the first photoresist pattern 55 and the second photoresist pattern 50, so as to form a groove 552 surrounding the first photoresist pattern 55. The groove 552 exposes the first photoresist pattern 55, so that the developer may contact the first photoresist pattern 55 through the groove 552 in the subsequent second development process.

Figure 10B:
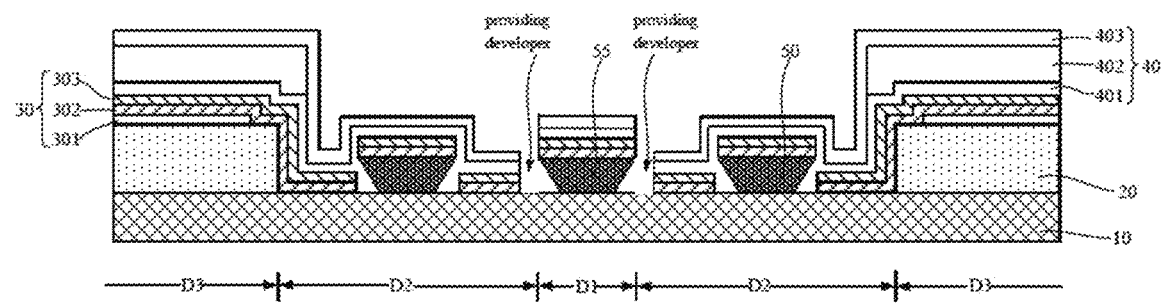

Then, in the step S60, referring to FIG. 10B, a developer with a high concentration may be used or a development with a long period may be performed to remove the first photoresist pattern 55 and each of the film layers (including the organic light-emitting layer 302, the second electrode layer 303, the first inorganic encapsulating layer 401, and the second inorganic encapsulating layer 403 provided on a side of the first photoresist pattern 55 away from the substrate 10) on the first photoresist pattern 55. In this way, through a lift-off process, the opening 103 may be formed in the first area D1 of the substrate 10.

Optionally, components of the developer used in the step S60 may be the same as that of the developer used in the above step S30, however, the concentration of the developer used in the step S60 is greater than the concentration of the developer used in the step S30. Alternatively or additionally, the components and the concentration of the developer used in the step S60 may be the same as the components and the concentration of the developer used in the step S30, however, the development period in the step S60 is longer than the development period in the step S30. In this way, the first photoresist pattern 55 and each of the film layers disposed on the first photoresist pattern 55 may be removed through a development process. Meanwhile, since the boss portion (i.e., the second photoresist pattern) 50 located in the second area D2 is fully exposed in the above step S30, the development process in the step S60 will not remove the boss portion (i.e., the second photoresist pattern) 50 located in the second area D2. That is, in the step S60, while retaining the boss portion (i.e., the second photoresist pattern) 50 located in the second area D2, the first photoresist pattern 55 located in the first area D1 and each of the film layers disposed on the first photoresist pattern 55 are removed.

In the embodiments of the present disclosure, the opening may be formed without using a laser ablation process, thereby requiring no investment in laser processing equipment, which is beneficial for simplifying the manufacturing process and reducing manufacturing cost. In addition, the step of forming the opening follows the step of forming the encapsulating structure, that is, the encapsulating structure may protect the organic light-emitting element during forming the opening, which facilitates the transmission of the organic light-emitting element during the production process. Thus, the production equipment may be arranged at a relatively large freedom, and it is beneficial to protect the organic light-emitting element during the manufacturing.

It should be noted that the organic light-emitting display device and/or any other related devices or components according to the embodiments of the present disclosure may be implemented by using any suitable hardware, firmware (e.g., application specific integrated circuit), software, or suitable combinations of the software, firmware, and hardware. For example, various components of the organic light-emitting display device may be formed on one integrated circuit (IC) chip or on a separate IC chip. In addition, various components of the organic light-emitting display device may be implemented on a flexible printed circuit film, a tape carrier package (TCP), a printed circuit board (PCB), or may be formed on the same substrate. In addition, the various components of the organic light-emitting display device may be processes or threads running on one or more processors in one or more computer devices that execute computer program instructions and interact with other system components for performing various functions described herein. The computer program instructions are stored in a memory, which may be implemented in a computing device that uses standard memory devices, such as random access memory (RAM). The computer program instructions may also be stored in other non-volatile computer-readable media (such as CD-ROM or flash drive, etc.). In addition, without departing from the scope of the embodiments of the present disclosure, those skilled in the art should recognize that the functions of various computing devices may be combined or integrated into a single computing device, or the functions of specific computing devices may be allocated into one or more other computing devices.

The above descriptions are only some exemplary embodiments of the present disclosure and are used to explain the general inventive concept of the present disclosure. Those skilled in the art should understand that the protection scope of the present disclosure is not limited to technical solutions formed by the specific combination of the above technical features, but also covers other technical solutions which are formed by an combinations of the above technical features or their equivalents without departing from the general inventive concept, for example, the technical solutions which are formed by replacing the above features with technical features, disclosed in the present disclosure (but not limited to), having the similar functions.

What is claimed is:

1. A method for manufacturing an organic light-emitting display device, comprising the following steps:
   providing a substrate comprising a first area, a second area and a third area, the second area being located between the first area and the third area;
   forming a photoresist on the substrate, the photoresist covering the first area, the second area, and the third area of the substrate;
   forming a first photoresist pattern in the first area of the substrate and a second photoresist pattern in the second area of the substrate, through an exposure process and a first development process;
   sequentially forming a first electrode layer, an organic light-emitting layer and a second electrode layer on the substrate so that at least one of the organic light-emitting layer and the second electrode layer is disconnected at the second photoresist pattern; and
   removing the first photoresist pattern in the first area of the substrate and film layers on the first photoresist pattern, and retaining the second photoresist pattern in the second area of the substrate, through a second development process, to form an opening configured to receive a hardware structure in the first area and a boss portion in the second area, wherein an orthographic projection of the boss portion on the substrate surrounds an orthographic projection of the opening on the substrate, and the opening has a bottom surface which is a part of a surface of the substrate;
   wherein the step of sequentially forming a first electrode layer, an organic light-emitting layer and a second electrode layer on the substrate so that at least one of the organic light-emitting layer and the second electrode layer is disconnected at the second photoresist pattern comprises:
      forming the organic light-emitting layer and the second electrode layer through an evaporation process, so that both the organic light-emitting layer and the second electrode layer are disconnected at the second photoresist pattern; and
   wherein the organic light-emitting layer comprises:
      a first portion located on a side of the boss portion near the third area, wherein the first portion is spaced apart from the boss portion;
      a second portion located on a surface of the boss portion away from the substrate, wherein the first portion is disconnected with the second portion; and
      a third portion located in the second area and on a side of the boss portion near the first area, wherein the third portion is disconnected with the second portion, the third portion is spaced apart from the boss portion, and a side wall of the third portion faces the opening and surrounds the opening,
   wherein the step of forming a first photoresist pattern in the first area of the substrate and a second photoresist pattern in the second area of the substrate through an exposure process and a first development process comprises:
      fully exposing a part of the photoresist in the second area, partially exposing a part of the photoresist in the first area, and unexposing a remaining part of the photoresist in the second and a part of the photoresist in the third area; and
      performing the first development process to remove unexposed parts of the photoresist, so as to form the first photoresist pattern in the first area of the substrate and the second photoresist pattern in the second area of the substrate; and
   wherein a concentration of a developer used in the first development process is less than a concentration of a developer used in the second development process; and/or
      a development time in the first development process is less than a development time used in the second development process.

2. The method according to claim 1, wherein the photoresist is a negative photoresist.

3. The method according to claim 1, wherein, before the step of removing the first photoresist pattern in the first area of the substrate and film layers on the first photoresist pattern, the method further comprises:
   forming an encapsulating structure on a side of the second electrode layer away from the substrate,
   wherein the encapsulating structure covers the second electrode layer, the first photoresist pattern and the second photoresist pattern.

4. The method according to claim 3, wherein, between the step of forming an encapsulating structure on a side of the second electrode layer away from the substrate and the step of removing the first photoresist pattern in the first area of the substrate and film layers on the first photoresist pattern, the method further comprises:
   removing film layers disposed on the substrate and located between the first photoresist pattern and the second photoresist pattern, through a dry etching process, to form a groove exposing the first photoresist pattern.

5. The method according to claim 1, wherein the step of removing the first photoresist pattern in the first area of the substrate and film layers on the first photoresist pattern comprises:
   simultaneously removing the first photoresist pattern in the first area of the substrate and a part of each of the organic light-emitting layer, the second electrode layer and the encapsulating structure on the first photoresist pattern, through the second development process.

* * * * *